US 9,461,621 B2

(12) United States Patent
Yamato

(10) Patent No.: US 9,461,621 B2
(45) Date of Patent: Oct. 4, 2016

(54) DUPLEXER AND MODULE INCLUDING THE SAME

(71) Applicant: Murata Manufacturing Co., Ltd., Nagaokakyo-shi, Kyoto-fu (JP)

(72) Inventor: Syuji Yamato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 10 days.

(21) Appl. No.: 14/560,148

(22) Filed: Dec. 4, 2014

(65) Prior Publication Data

US 2015/0084712 A1    Mar. 26, 2015

Related U.S. Application Data

(63) Continuation of application No. PCT/JP2013/066789, filed on Jun. 19, 2013.

(30) Foreign Application Priority Data

Jul. 19, 2012 (JP) .................. 2012-160778

(51) Int. Cl.
*H03H 9/72* (2006.01)
*H03H 9/00* (2006.01)
*H03H 9/05* (2006.01)
*H03H 9/64* (2006.01)

(52) U.S. Cl.
CPC .......... *H03H 9/725* (2013.01); *H03H 9/0028* (2013.01); *H03H 9/0576* (2013.01); *H03H 9/0085* (2013.01); *H03H 9/6459* (2013.01)

(58) Field of Classification Search
CPC .. H03H 9/0028; H03H 9/0576; H03H 9/725; H03H 9/0085; H03H 9/6459
USPC ......................................... 333/133, 193–196
See application file for complete search history.

(56) References Cited

U.S. PATENT DOCUMENTS

| 7,242,268 B2* | 7/2007 | Hagiwara ................. H01P 1/15 333/103 |
| 2008/0284540 A1 | 11/2008 | Nishihara et al. |
| 2010/0026414 A1* | 2/2010 | Iwaki ..................... H03H 9/725 333/100 |
| 2010/0194488 A1 | 8/2010 | Yoshimoto |

(Continued)

FOREIGN PATENT DOCUMENTS

| JP | 2008-271230 A | 11/2008 |
| JP | 2009-290606 A | 12/2009 |

(Continued)

OTHER PUBLICATIONS

Official Communication issued in International Patent Application No. PCT/JP2013/066789, mailed on Aug. 20, 2013.

*Primary Examiner* — Benny Lee
*Assistant Examiner* — Jorge Salazar, Jr.
(74) *Attorney, Agent, or Firm* — Keating & Bennett, LLP

(57) ABSTRACT

A first filter channel with superior attenuation characteristics for transmission signals and is less susceptible to influence of transmission signals inputted to a transmission SAW filter device, is disposed closer to a transmission terminal, whereas a second filter channel with poor attenuation characteristics in a transmission band and is more susceptible to the influence of transmission signals inputted to the transmission SAW filter device, is disposed farther from a transmission terminal to improve isolation characteristics in a differential mode of a duplexer.

19 Claims, 5 Drawing Sheets

(56) References Cited

U.S. PATENT DOCUMENTS

| | | |
|---|---|---|
| 2012/0062336 A1 | 3/2012 | Yoshimoto |
| 2012/0098618 A1 | 4/2012 | Tanaka |
| 2012/0286896 A1* | 11/2012 | Takamine ............ H03H 9/6483 333/133 |
| 2012/0293276 A1 | 11/2012 | Iwaki et al. |

FOREIGN PATENT DOCUMENTS

| | | |
|---|---|---|
| JP | 2010-178306 A | 8/2010 |
| JP | 2011-160203 A | 8/2011 |
| JP | 2012-085279 A | 4/2012 |
| WO | 2010/150882 A1 | 12/2010 |

* cited by examiner

DUPLEXER AND MODULE INCLUDING THE SAME

BACKGROUND OF THE INVENTION

1. Field of the Invention

The present invention relates to duplexers including a transmission SAW filter device and a reception SAW filter device, and to modules that include such duplexers.

2. Description of the Related Art

A duplexer that includes a transmission SAW filter device and a reception SAW filter device has been proposed (see Japanese Unexamined Patent Application Publication No. 2010-178306 (paragraphs [0011] to [0018], FIG. 1, abstract, etc.), for example). In the conventional duplexer 500 shown in FIG. 9, a ladder-type transmission SAW filter device 504 that outputs, to a common terminal 503, an unbalanced transmission signal inputted from an unbalanced transmission terminal 502, and a longitudinally coupled resonator-type reception SAW filter device 507 that outputs an unbalanced reception signal, inputted to the common terminal 503, to balanced reception terminals 505 and 506 in a balanced state, are formed on one main surface of a piezoelectric substrate 501.

The transmission SAW filter device 504 includes serial arm resonators 504a to 504c connected in series between the transmission terminal 502 and the common terminal 503 and parallel arm resonators 504d and 504e connected at one end between the respective serial arm resonators 504a to 504c and connected at the other end to a ground terminal 508, and each of the resonators 504a to 504e is formed with reflectors disposed on both sides in the direction in which surface acoustic waves travel along interdigital electrodes. The reception SAW filter device 507 includes a longitudinally coupled resonator-type filter element 507b connected to the common terminal 503 via a resonator 507a that functions as a transporter and a longitudinally coupled resonator-type filter element 507c connected in a stage after the longitudinally coupled resonator-type filter element 507b.

The longitudinally coupled resonator-type filter element 507b is formed with three interdigital electrodes arranged in parallel in the direction in which surface acoustic waves travel and with reflectors disposed on both sides of the direction in which the interdigital electrodes are arranged. Of the three interdigital electrodes that form the longitudinally coupled resonator-type filter element 507b, one end of each interdigital electrode on either side is connected to the longitudinally coupled resonator-type filter element 507c in the later stage, and the other end is connected to a ground terminal 509 and grounded. One end of the interdigital electrode in the center is connected to the ground terminal 509 and grounded, and the common terminal 503 is connected to the other end via the resonator 507a and an unbalanced reception signal is inputted to that other end.

The longitudinally coupled resonator-type filter element 507c is formed with four interdigital electrodes arranged in parallel in the direction in which surface acoustic waves travel and with reflectors disposed on both sides of the direction in which the interdigital electrodes are arranged. Of the four interdigital electrodes that form the longitudinally coupled resonator-type filter element 507c, one end of each interdigital electrode on either side is connected to the ground terminal 509 and grounded, and the output of the longitudinally coupled resonator-type filter element 507b in the previous stage is inputted to the other ends of these interdigital electrodes. Of each interdigital electrode in the center, one end is connected to the reception terminals 505 and 506, the other end is connected to the ground terminal 509 and grounded, and a balanced reception signal is outputted from the reception terminals 505 and 506.

A shield electrode 510 that is connected to the ground terminal 509 and grounded is formed on the one main surface of the piezoelectric substrate 501 so as to surround the reception SAW filter device 507, in order to improve isolation characteristics between the transmission SAW filter device 504 and the reception SAW filter device 507. In the reception SAW filter device 507, the longitudinally coupled resonator-type filter elements 507b and 507c are configured so that balanced reception signals having almost the same amplitude but with phases that are shifted from each other by approximately 180° are outputted from the reception terminals 505 and 506, respectively.

However, the conventional duplexer 500 has a problem in that it is necessary to form the shield electrode 510 surrounding the reception SAW filter device 507 on the one main surface of the piezoelectric substrate 501 in order to improve the isolation characteristics between the transmission SAW filter device 504 and the reception SAW filter device 507, which increases the size of the duplexer 500.

SUMMARY OF THE INVENTION

Preferred embodiments of the present invention provide a technique that achieves an improvement in isolation characteristics between a transmission filter device and a reception filter device without increasing the size of a duplexer.

A duplexer according to an aspect of various preferred embodiments of the present invention includes a transmission SAW filter device configured to output, to a common terminal, an unbalanced transmission signal in a first frequency band that has been inputted from an unbalanced transmission terminal, and a reception SAW filter device configured to output, in a balanced state to balanced first and second reception terminals, an unbalanced reception signal in a second frequency band inputted to the common terminal. The reception SAW filter device includes a first filter channel spanning from the common terminal to the first reception terminal and a second filter channel spanning from the common terminal to the second reception terminal, and of the first and second filter channels, the filter channel having poorer attenuation characteristics in the transmission signal band at the respective first and second reception terminals when the transmission signal is inputted to the common terminal is located farther from the transmission terminal than the other filter channel.

According to this aspect of various preferred embodiments of the present invention, the reception SAW filter device includes the first filter channel spanning from the common terminal to the first reception terminal and the second filter channel spanning from the common terminal to the second reception terminal. Of the first and second filter channels, the one filter channel, which has poor attenuation characteristics for the transmission signals in the first and second reception terminals when a transmission signal is inputted to the common terminal, is located farther from the transmission terminal than the other filter channel. In other words, of the first and second filter channels provided in the reception SAW filter device, the filter channel that has good attenuation characteristics in the transmission signal band and is less susceptible to the influence of transmission signals inputted to the transmission SAW filter device is disposed closer to the transmission terminal, whereas the filter channel that has poor attenuation characteristics in the transmission signal band and is more susceptible to the influence of transmission signals inputted to the transmission SAW filter device is disposed farther from the transmission terminal.

Generally speaking, disposing the reception SAW filter device farther from, rather than closer to, the transmission terminal makes it possible to prevent transmission signals inputted to the transmission terminal from interfering with reception signals inputted to the reception SAW filter device. Accordingly, by disposing the filter channels as described above, respective degrees of negative influence in the filter channels, caused by the transmission signals inputted to the transmission SAW filter device interfering with each other in the respective first and second filter channels of the reception SAW filter device, are brought closer to each other, which makes it possible to improve the isolation characteristics in a differential mode of the duplexer. Accordingly, the isolation characteristics between the transmission SAW filter device and the reception SAW filter device are improved without providing a shielding device such as a shield electrode or the like and increasing the size of the duplexer as required in conventional devices.

According to another aspect of various preferred embodiments of the present invention, preferably, the duplexer further includes a piezoelectric substrate, which preferably is rectangular or substantially rectangular in shape when viewed from above, on one main surface of which a ladder-type transmission SAW filter device and a longitudinally coupled resonator-type reception SAW filter device are provided. Furthermore, preferably, the transmission SAW filter device is located in one region of the one main surface sectioned off by an imaginary line that is perpendicular or substantially perpendicular to a pair of opposing sides of the piezoelectric substrate; the reception SAW filter device is located in another region of the one main surface sectioned off by the imaginary line; the common terminal is disposed near or adjacent to a position where one of the pair of opposing sides intersects with the imaginary line; the transmission terminal is disposed at the position of an end portion, of the one region, that is close to or adjacent to the other of the pair of opposing sides and far or spaced from the imaginary line; the one filter channel is disposed on the one of the opposing sides so that the reception terminal in the one filter channel is disposed in the position of an end portion, of the other region, that is close to or adjacent to the one of the pair of opposing sides and far or spaced from the imaginary line; and the other filter channel is disposed on the other of the opposing sides of the pair so that the reception terminal in the other filter channel is disposed in the position of an end portion, of the other region, that is close to or adjacent to the other of the pair of opposing sides and far or spaced from the imaginary line.

Such a configuration makes it possible to provide the duplexer with a practical configuration, in which the transmission SAW filter device and the reception SAW filter device are disposed on the one main surface of the piezoelectric substrate in a well-balanced manner.

A module according to another aspect of various preferred embodiments of the present invention includes the above-mentioned duplexer, and a module board on which the duplexer is mounted.

According to this aspect of various preferred embodiments of the present invention, mounting the duplexer, which has improved isolation characteristics without an increase in size, on the module board makes it possible to provide the module with a practical configuration in which the size of the module has been reduced.

According to various preferred embodiments of the present invention, of the first and second filter channels in the reception SAW filter device, the one filter channel, which has a low attenuation for the transmission signals in the first and second reception terminals when a transmission signal is inputted to the common terminal, is located farther from the transmission terminal than the other filter channel, and thus the respective degrees of negative influence in the filter channels, caused by the transmission signals inputted to the transmission SAW filter device interfering with each other in the respective first and second filter channels of the reception SAW filter device, are brought closer to each other, which makes it possible to improve the isolation characteristics between the transmission filter device and the reception filter device without increasing the size of the duplexer due to a shielding device such as a shield electrode or the like being required as in conventional devices.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
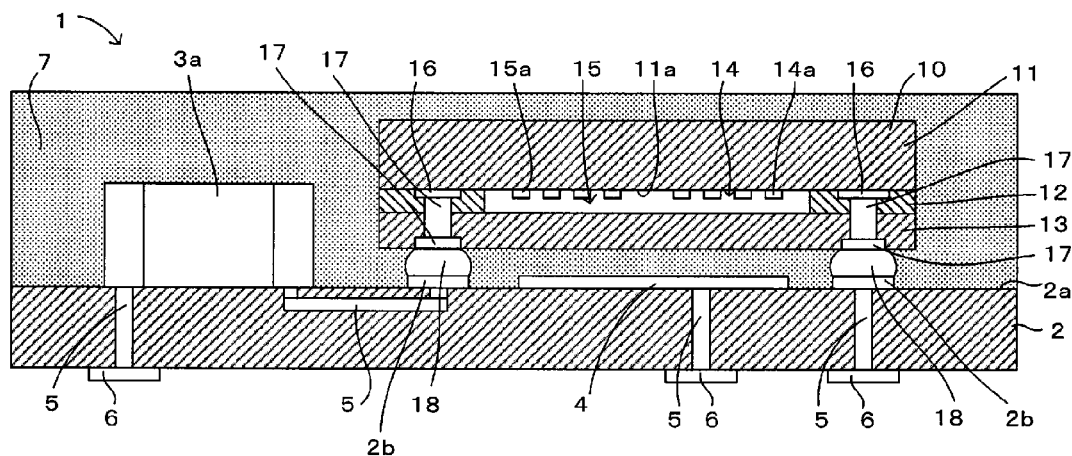
FIG. 1 is a diagram illustrating a module including a preferred embodiment of the present invention.
Figure 2:
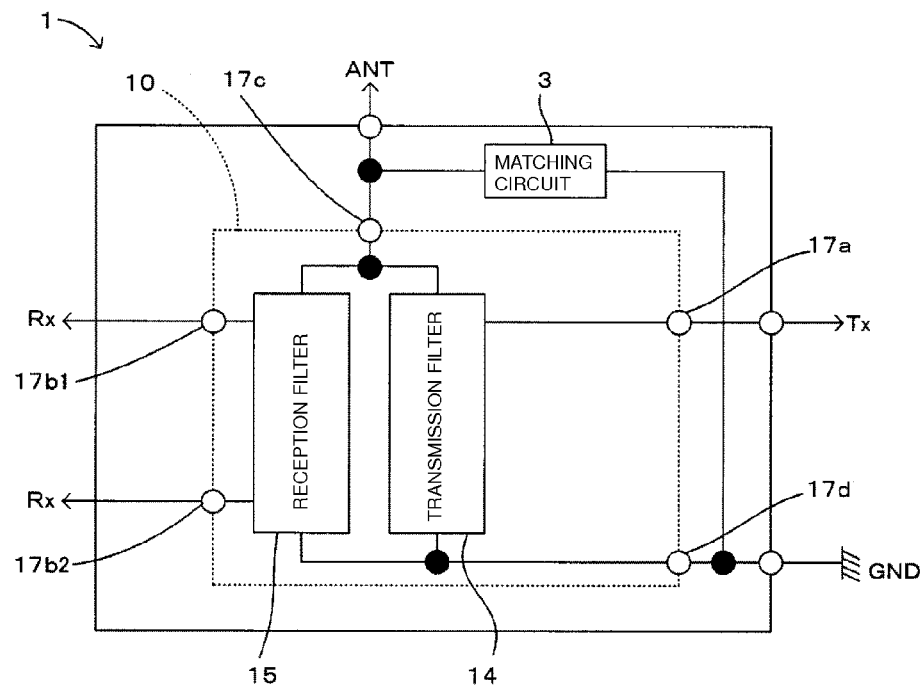
FIG. 2 is a block diagram illustrating the electrical configuration of the module shown in FIG. 1.
Figure 3:
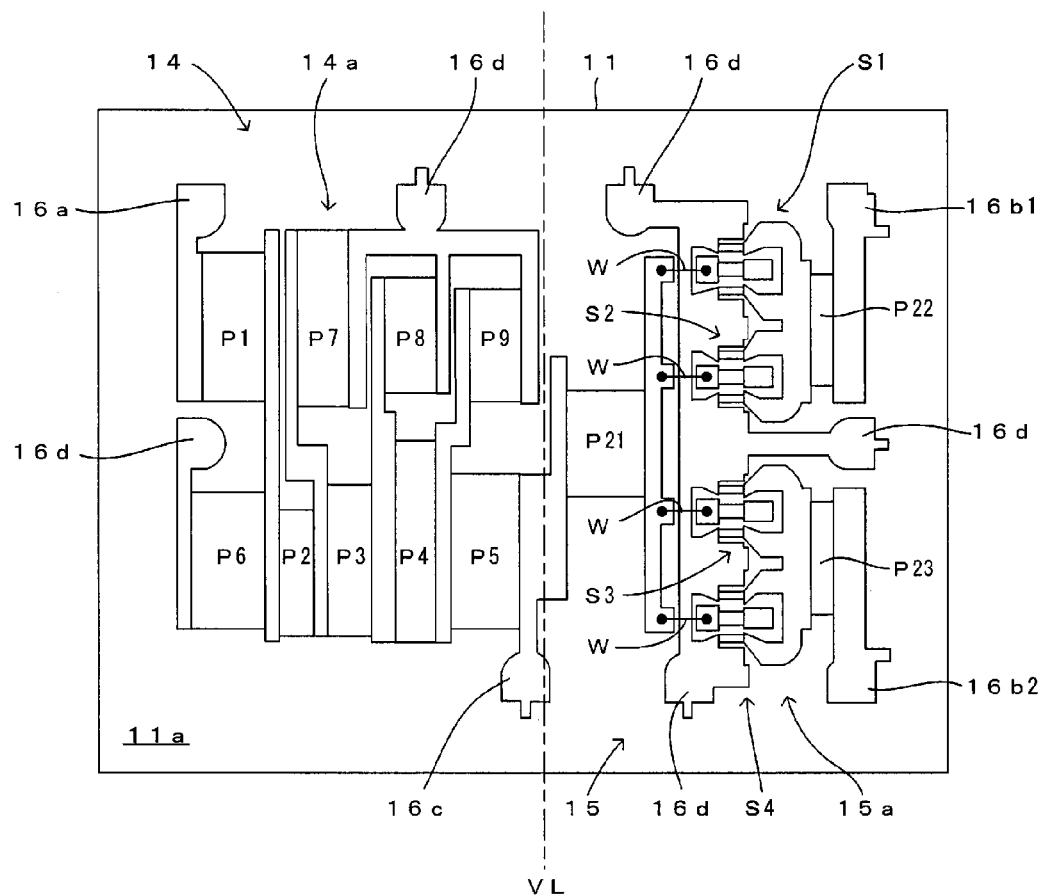
FIG. 3 is a plan view illustrating one main surface of a device substrate provided in a duplexer, on which SAW filter devices are located.
Figure 4:
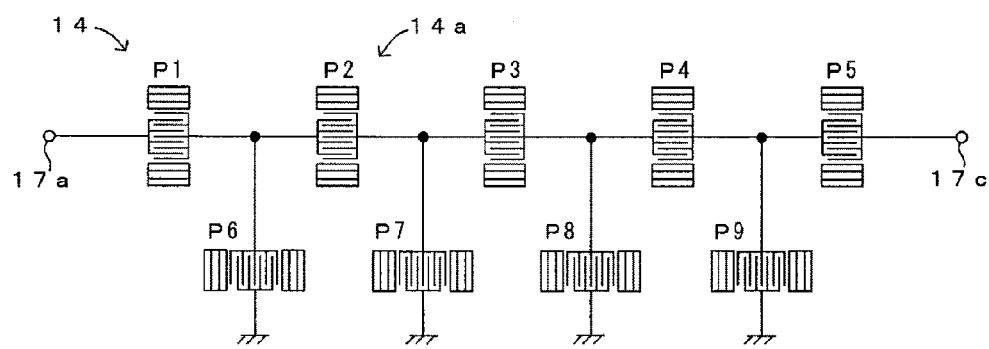
FIG. 4 is a schematic diagram illustrating the circuit configuration of a transmission SAW filter device.
Figure 5:
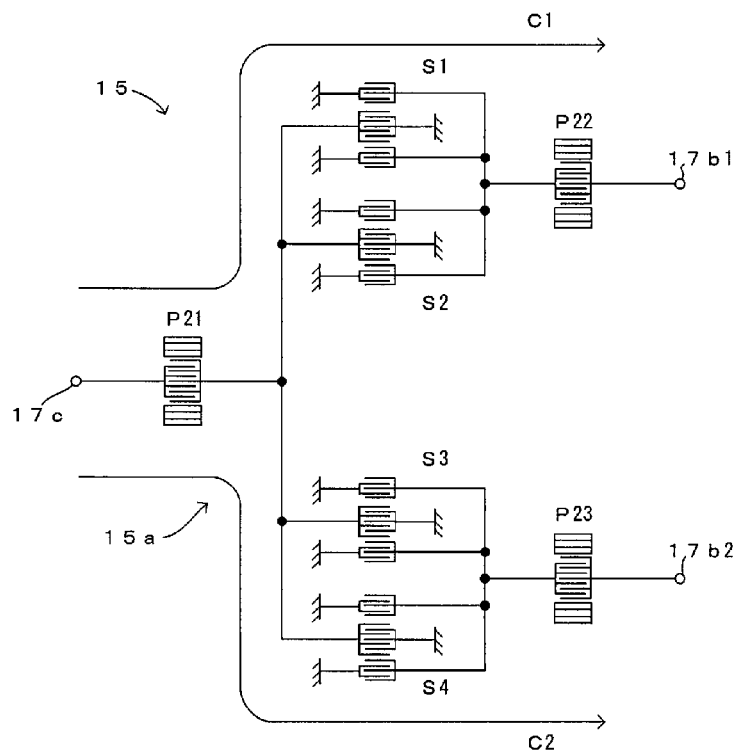
FIG. 5 is a schematic diagram illustrating the circuit configuration of a reception SAW filter device.

Modules including duplexers according to various preferred embodiments of the present invention will be described with reference to FIGS. 1 to 8. FIG. 1 is a diagram illustrating a preferred embodiment of the module of the present invention, and FIG. 2 is a block diagram illustrating the electrical configuration of the module shown in FIG. 1. FIG. 3 is a plan view illustrating one main surface of a device substrate provided in the duplexer, on which filter devices are located, FIG. 4 is a schematic diagram illustrating the circuit configuration of a transmission SAW filter device, and FIG. 5 is a schematic diagram illustrating the circuit configuration of a reception SAW filter device.

Figure 6:
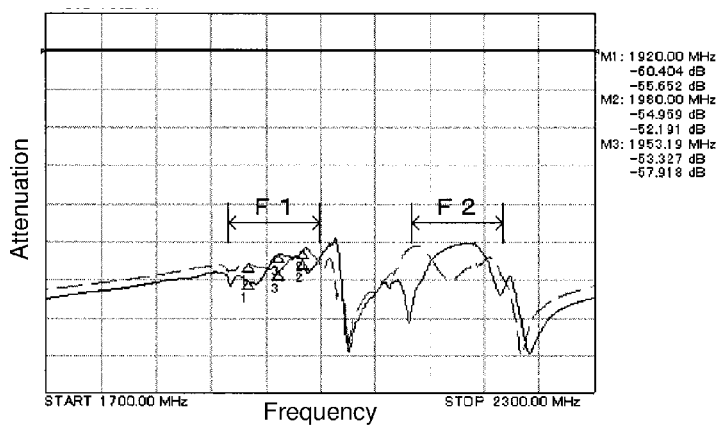
FIG. 6 is a diagram illustrating isolation characteristics in a first filter channel of a reception SAW filter device.
Figure 7:
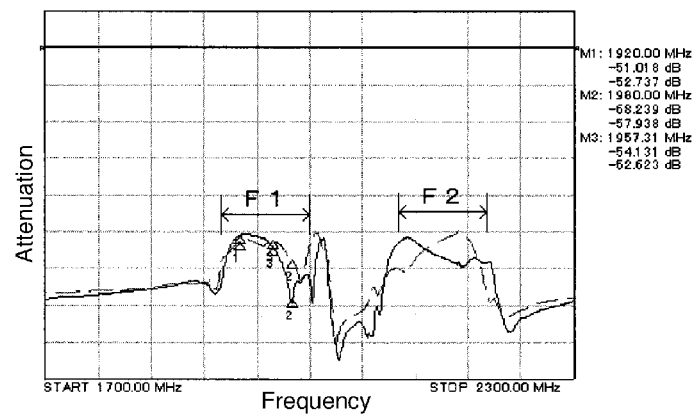
FIG. 7 is a diagram illustrating isolation characteristics in a second filter channel of a reception SAW filter device.
Figure 8:
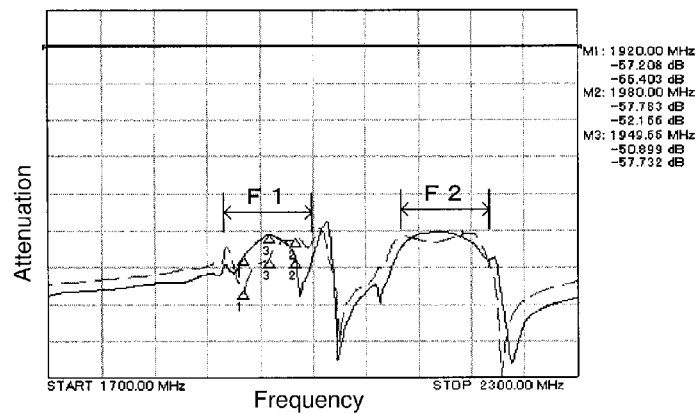
FIG. 8 is a diagram illustrating isolation characteristics of a duplexer in a differential mode.
Figure 9:
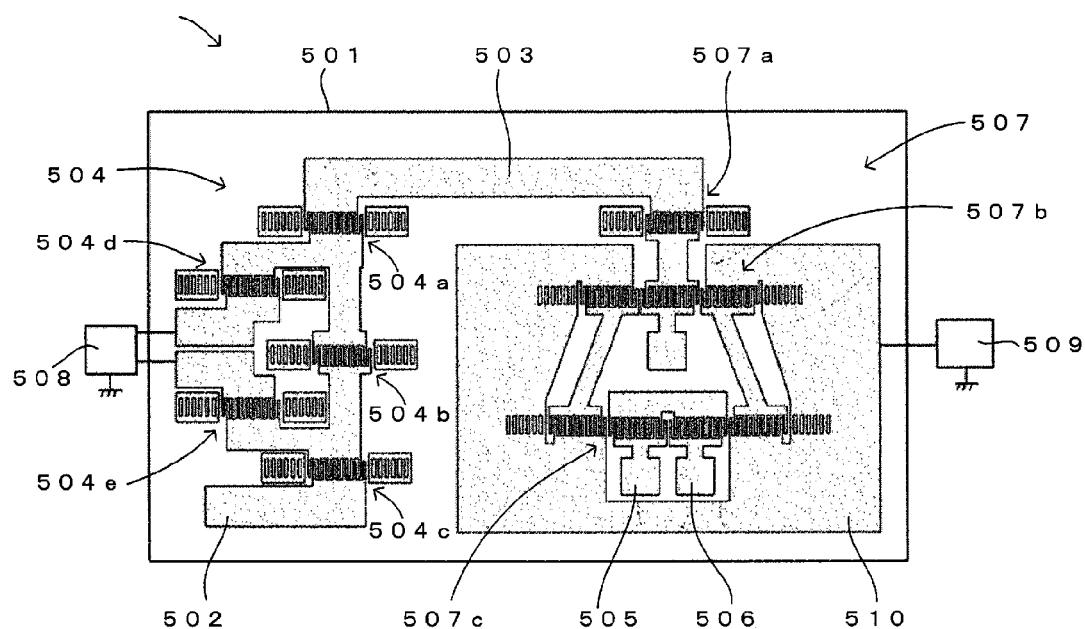
FIG. 9 is a diagram illustrating a conventional duplexer.

FIG. 6 is a diagram illustrating isolation characteristics in a first filter channel of the reception SAW filter device, FIG. 7 is a diagram illustrating isolation characteristics in a second filter channel of the reception SAW filter device, and FIG. 8 is a diagram illustrating isolation characteristics of the duplexer in a differential mode. Note that FIGS. 1 to 5 illustrate only primary configurations of pertinence to various preferred embodiments of the present invention, and other configurations have been omitted from the drawings.

A module 1 shown in FIG. 1 and FIG. 2 is mounted on a motherboard provided in a mobile communication terminal such as a cellular phone, a mobile information terminal, or the like, and in this preferred embodiment defines a high-frequency antenna switching module including a duplexer 10 including a transmission filter 14 and a reception filter 15, a module board 2, a matching circuit 3, a ground electrode 4, various types of electronic components such as switching ICs, filters, resistances, capacitors, coils, and so on (not shown), and a resin layer 7.

The duplexer 10 and electronic components such as a chip coil 3a are mounted on electrodes 2b provided on a mounting surface 2a of the module board 2, and are electrically connected to a plurality of mounting electrodes 6 mounted on a rear surface of the module board 2 via an interconnect pattern 5 provided on the module board 2. By mounting the module 1 on the motherboard, the module 1 is connected to various types of signal lines and power lines provided in the motherboard, such as an antenna line ANT, a ground line GND, a transmission signal line Tx, a reception signal line Rx, and so on, and transmission/reception signals are outputted/inputted between the motherboard and the module 1.

The module board 2 in this preferred embodiment preferably includes an integrated ceramic multilayer body that includes a plurality of dielectric layers defined by ceramic green sheets. That is, the ceramic green sheets defining the dielectric layers preferably are formed by a molding device creating sheets from a slurry in which mixed particles of alumina, glass, and so on are intermixed with an organic binder, a solvent, and the like, and are formed so as to be capable of experiencing so-called low-temperature firing, which is carried out at a low temperature of approximately 1000° C., for example. The respective dielectric layers are preferably formed by forming via holes through laser processing or the like in ceramic green sheets cut into a predetermined shape, forming via conductors for interlayer connections by filling the via holes that have been formed with a conductive paste composed of Ag, Cu, or the like, carrying out via fill plating, or the like, and forming various electrode patterns by printing using a conductive paste.

Likewise, the interconnect pattern 5 configured to connect the duplexer 10 and the electronic components such as the chip coil 3a mounted on the module board 2, the ground electrode 4, the mounting electrodes 6, and so on are provided in the module board 2 preferably by forming via conductors and electrode patterns as appropriate in the respective dielectric layers. In other words, by providing the electrode patterns and the via conductors in the respective dielectric layers as appropriate and forming the ground electrode 4, the interconnect pattern 5, the mounting electrodes 6, and so on, the duplexer 10 and the electronic components such as the chip coil 3a that are mounted on the module board 2 are electrically connected to the mounting electrodes 6. Circuit elements such as capacitors, coils, or the like may be defined by the electrode patterns and the via conductors provided in or on the respective dielectric layers, filter circuits, the matching circuit 3, and so on may be defined by the circuit elements including the capacitors and coils, and so on.

The matching circuit 3 in this preferred embodiment preferably includes the chip coil 3a, which is a chip component mounted on the mounting surface 2a of the module board 2, and is connected to an output side of the transmission filter 14 and an input side of the reception filter 15 via a common terminal 17c of the duplexer 10.

The ground electrode 4 is provided on the mounting surface 2a of the module board 2, disposed below the duplexer 10, and is electrically connected to the ground line GND. Note that the ground electrode 4 is connected to a ground terminal electrode of the duplexer 10 by a connecting electrode such as a solder ball or the like (not shown).

The resin layer 7 is provided on the mounting surface 2a so as to cover side surfaces and an upper surface of the duplexer 10, and other electronic components are also covered in the same manner by the resin layer 7.

The duplexer 10 preferably has a wafer-level chip-scale package (WL-CSP) structure, and includes a device substrate 11 (corresponding to a "piezoelectric substrate"), an insulating layer 12, a cover layer 13, and the transmission filter 14 and reception filter 15 whose high-frequency signal pass-bands differ.

The device substrate 11 in this preferred embodiment preferably is made of a piezoelectric material such as lithium niobate, lithium tantalate, quartz, or the like. Meanwhile, a SAW (surface acoustic wave) filter element is configured preferably by providing interdigital electrodes (interdigital transducer electrodes) made of Al, Cu, or the like, reflectors, and so on in a predetermined region of one main surface 11a of the device substrate 11, and a transmission SAW filter device 14a included in the transmission filter 14 and a reception SAW filter device 15a included in the reception filter 15 are defined by the SAW filter elements configured of the interdigital electrodes, the reflectors, and so on.

In addition, terminal electrodes 16 that are connected to the interdigital electrodes, the reflectors, and so on of which the transmission SAW filter device 14a and the reception SAW filter element 15a are defined are located on the one main surface 11a of the device substrate 11. In addition, by connecting electrodes 17 to respective terminal electrodes 16 through the insulating layer 12, a transmission terminal 17a connected to an input side of the transmission filter 14 (the transmission SAW filter device 14a), first and second reception terminals 17b1 and 17b2 connected to an output side of the reception filter 15 (the reception SAW filter element 15a), the common terminal 17c (antenna terminal) connected to the output side of the transmission filter 14 and the input side of the reception filter 15, and a ground terminal 17d, are provided in the duplexer 10.

The insulating layer 12 is disposed so as to enclose a predetermined region of the one main surface 11a of the device substrate 11, where the interdigital electrodes and the reflectors are provided. Specifically, the insulating layer 12 is formed preferably by first forming a resin layer using a photosensitive epoxy resin, polyimide resin, or the like on the one main surface 11a of the device substrate 11 where the interdigital electrodes, the reflectors, and the terminal electrodes 16 are provided, and then removing the resin layer from the predetermined region where the interdigital electrodes and the reflectors are provided and the region of the terminal electrodes 16 through a photolithography process.

The cover layer 13 is layered on the insulating layer 12 and provides a space enclosed between the device substrate 11 and the insulating layer 12, and the transmission SAW filter device 14a and the reception SAW filter element 15a are disposed in that space. Specifically, the cover layer 13 is formed preferably by, for example, forming a photosensitive epoxy resin, polyimide resin, or the like on the insulating layer 12 and providing connection holes in the stacked resin layers using a photolithography process, and then filling the connection holes with a paste of Cu, Al, or the like, carrying out via fill plating, or the like in order to form the electrodes 17 connected to the terminal electrodes 16. Then, the transmission terminal 17a, the reception terminals 17b1 and 17b2, the common terminal 17c, and the ground terminal 17d are defined by the electrodes 17 that are connected to the terminal electrodes 16 and exposed from the cover layer 13, solder balls 18 are formed on the respective terminals 17a to 17d, and the duplexer 10 is completed as a result.

Note that the duplexer 10 is mounted on the mounting surface 2a so that the cover layer 13 opposes the mounting surface 2a of the module board 2 and an upper surface defined by another main surface of the device substrate 11 is exposed from the resin layer 7.

Next, the configurations of the transmission filter 14 and the reception filter 15 will be described in detail.

The transmission SAW filter device 14a included in the transmission filter 14 is configured to output, to the common terminal 17c, an unbalanced transmission signal in a first frequency band F1 inputted from the unbalanced transmission terminal 17a, and as shown in FIG. 3 and FIG. 4, is defined by resonators having interdigital electrodes and reflectors being connected in a ladder configuration in one region of the one main surface 11a sectioned off by an imaginary line VL perpendicular or substantially perpendicular to a pair of opposing sides of the device substrate 11. Specifically, the transmission SAW filter device 14a includes serial arm resonators P1 to P5 connected in series between a transmission terminal electrode 16a connected to the electrode 17 that defines the transmission terminal 17a and a common terminal electrode 16c connected to the electrode 17 that defines the common terminal 17c, and parallel arm resonators P6 to P9 whose one ends are connected between the respective serial arm resonators P1 to P5 and whose other ends are connected to a ground terminal electrode 16d connected to the electrode 17 that defines the ground terminal 17d. The respective resonators P1 to P9 are provided with reflectors disposed on either side of interdigital electrodes in the direction in which surface acoustic waves travel.

The reception SAW filter device 15a included in the reception filter 15 is configured to output, in a balanced state to the balanced first and second reception terminals 17b1 and 17b2, an unbalanced reception signal in a second frequency band F2 inputted to the common terminal 17c, and as shown in FIG. 3 and FIG. 5 is defined by longitudinally coupled resonator-type filter elements S1 and S2 connected in parallel in another region of the one main surface 11a of the device substrate 11 sectioned off by the imaginary line VL. The reception SAW filter device 15a includes a first filter channel C1 spanning from the common terminal electrode 16c to a first reception terminal electrode 16b1 connected to the electrode 17 that defines the first reception terminal 17b1 and a second filter channel C2 spanning from the common terminal electrode 16c to a second reception terminal electrode 16b2 connected to the electrode 17 that defines the second reception terminal 17b2. Of the first and second filter channels C1 and C2, the second filter channel C2, which has poor attenuation characteristics in the transmission signal bands at the first and second reception terminals 17b1 and 17b2 when a transmission signal in the first frequency band F1 is inputted to the common terminal 17c, is located farther from the transmission terminal 17a than the first filter channel C1.

Specifically, the filter elements S1 and S2 connected to the common terminal electrode 16c via a resonator P21 and connected to the first reception terminal electrode 16b1 in a later stage via a resonator P22 are arranged in parallel or substantially in parallel in the first filter channel C1, and filter elements S3 and S4 connected to the common terminal electrode 16c via the resonator P21 and connected to the second reception terminal electrode 16b2 in a later stage via a resonator P23 are arranged in parallel or substantially in parallel in the second filter channel C2. The respective filter elements S1 to S4 preferably include three interdigital electrodes arranged in parallel or substantially in parallel in the direction in which surface acoustic waves travel, as shown in FIG. 3 and FIG. 5. Of the three interdigital electrodes that define the filter elements S1 to S4, one end of each interdigital electrode on either side is connected to the resonators P22 and P23 in the later stage, and the other end is connected to the ground terminal electrode 16d and grounded. In addition, of the three interdigital electrodes that define the filter elements S1 to S4, one end of the interdigital electrode in the center is connected to the ground terminal electrode 16d and grounded, and the common terminal electrode 16c is connected to the other end via the resonator P21, with an unbalanced reception signal being inputted to the other end.

The outputs of the filter elements S1 and S2 are outputted to the first reception terminal 17b1 from the first reception terminal electrode 16b1 via the resonator P22, whereas the outputs of the filter elements S3 and S4 are outputted to the second reception terminal 17b2 from the second reception terminal electrode 16b2 via the resonator P23.

As shown in FIG. 3, the common terminal 17c (the common terminal electrode 16c) is disposed near or adjacent to a position where one of the pair of opposing sides of the device substrate 11 intersects with the imaginary line VL, and the transmission terminal 17a (the transmission terminal electrode 16a) is disposed in the position of an end portion, of the one region in the one main surface 11a sectioned off by the imaginary line VL, that is close to or adjacent to the other of the pair of opposing sides of the device substrate 11 and far or spaced from the imaginary line VL. The first filter channel C1 of the reception SAW filter device 15a is disposed so that the first reception terminal 17b1 (the first reception terminal electrode 16b1) thereof is in the position of an end portion, of the other region in the one main surface 11a sectioned off by the imaginary line VL, that is close to or adjacent to the other of the pair of opposing sides of the device substrate 11 and far or spaced from the imaginary line VL, whereas the second filter channel C2 of the reception SAW filter device 15a is disposed so that the second reception terminal 17b2 (the second reception terminal electrode 16b2) thereof is in a position, of the other region in the one main surface 11a sectioned off by the imaginary line VL, that is close to or adjacent to the one of the pair of opposing sides of the device substrate 11 and far or spaced from the imaginary line VL.

Note that in the reception SAW filter device 15a, the longitudinally coupled resonator-type filter elements S1 to S4 are configured so that balanced reception signals having almost the same amplitude but with phases that are shifted from each other by approximately 180° are outputted from the reception terminal electrodes 16b1 and 16b2, respectively. Furthermore, as shown in FIG. 3, the resonator P21 and the other ends of the central interdigital electrodes of the filter elements S1 to S4 are electrically connected by wires W. The resonators P21 to P23 preferably have the same configuration as the resonators P1 to P9, and thus descriptions thereof will be omitted.

Next, an overview of a non-limiting example of a method for manufacturing the module 1 shown in FIG. 1 will be described.

First, ceramic green sheets for forming the respective dielectric layers that configure the module board 2 are prepared by forming via holes using a laser or the like on ceramic green sheets formed in a predetermined shape, and via conductors (the interconnect pattern 5) for interlayer connection are formed by filling the via holes with a conductive paste, plating the via holes with a via fill, or the like; then, electrode patterns such as the mounting electrodes 2b, the ground electrode 4, the land-shaped interconnect pattern 5, and the mounting electrodes are printed onto the mounting surface 2a using a conductive paste. Note that a plurality of via conductors, electrode patterns, and so on are provided on the respective ceramic green sheets so that many module boards 2 can be formed at once.

Next, the dielectric layers are stacked so as to form a multilayer body. Grooves configured to split the multilayer body into individual module boards 2 after firing are then formed so as to surround regions corresponding to the respective module boards 2. Next, the multilayer body is fired at a low temperature, forming a collection of module boards 2.

Next, before dividing the multilayer body into individual module boards 2, various electronic components such as the duplexer 10, the chip coil 3a, and so on are mounted onto the mounting surface 2a of the collection of module boards 2. Next, a resin is provided on the mounting surface 2a of the collection of module boards 2 so as to cover the side surfaces of the duplexers 10, the resin is thermally set, and the resin layer 7 is provided on each of the module boards 2 as a result, thus forming a collection of the modules 1. The collection of modules 1 is then divided into individual modules, and the modules 1 are completed as a result.

With the module 1 formed in this manner, a transmission signal outputted from the transmission signal line Tx of the motherboard to the transmission terminal 17a of the duplexer 10 via the mounting electrodes 6 and the interconnect pattern 5 is inputted to the transmission filter 14 and a predetermined filtering process is carried out thereon, and the signal is then outputted from the common terminal 17c to the module board 2, and is outputted to the antenna line ANT of the motherboard via the interconnect pattern 5 (the matching circuit 3) and the mounting electrodes 6. In addition, a reception signal inputted from the antenna line ANT of the motherboard to the common terminal 17c of the duplexer 10 via the mounting electrodes 6 and the interconnect pattern 5 (the matching circuit 3) is inputted to the reception filter 15 and a predetermined filtering process is carried out thereon, and the signal is then outputted from the reception terminal 17b to the module board 2, and is outputted to the reception signal line Rx of the motherboard via the interconnect pattern 5 and the mounting electrodes 6.

Note that the module board 2 in which the interconnect pattern 5, the module 1 including the WL-CSP structure duplexer 10, and so on are not limited to being manufactured through the method described above, and may be formed using a typical known manufacturing method. The module board 2 can be formed from a printed board, an LTCC, an alumina-based substrate, a glass substrate, a composite material substrate, a single-layer substrate, a multilayer substrate, or the like that uses a resin, ceramic, or polymer material, and the optimal material for the module board 2 may be selected as appropriate based on the application of the module 1.

Next, isolation characteristics of the duplexer 10 will be described. Note that the isolation characteristics shown in FIG. 6 to FIG. 8 indicate the magnitude of a signal observed in the first and second reception terminals 17b1 and 17b2 when a signal having an arbitrary frequency is inputted to the transmission terminal 17a.

The solid lines in FIG. 6 to FIG. 8 indicate the isolation characteristics when, of the first and second filter channels C1 and C2, the second filter channel C2, which has poor attenuation characteristics in the transmission signal band at the first and second reception terminals 17b1 and 17b2 when a transmission signal in the first frequency band F1 is inputted to the common terminal 17c, is disposed closer to the transmission terminal 17a than the first filter channel C1, whereas the broken lines in FIG. 6 to FIG. 8 indicate the isolation characteristics when the second filter channel C2, which has poor attenuation characteristics in the transmission signal band, is disposed farther from the transmission terminal 17a than the first filter channel C1.

As shown in FIG. 6, the first filter channel C1 provides superior attenuation characteristics for the transmission signal in the first frequency band F1 as compared to the second filter channel C2, but by disposing the first filter channel C1 closer to the transmission terminal 17a than the second filter channel C2, the isolation characteristics of the first filter channel C1 in the first frequency band F1 degrade by approximately 1.1 dB (solid line→broken line in FIG. 6). On the other hand, as shown in FIG. 7, disposing the second filter channel C2, which has poorer attenuation characteristics for the transmission signal in the first frequency band F1 than the first filter channel C1, so as to be farther from the transmission terminal 17a than the first filter channel C1 improves the isolation characteristics of the second filter channel C2 in the first frequency band F1 by approximately 1.6 dB (solid line→broken line in FIG. 7).

Accordingly, because there is a better balance in the isolation characteristics in the first frequency band F1 between the first filter channel C1 and the second filter channel C2 of the reception SAW filter device 15a, the isolation characteristics in the first frequency band F1 in a differential mode of the duplexer 10 are improved by approximately 1.3 dB, as shown in FIG. 8 (solid line→broken line in FIG. 8).

As described thus far, according to this preferred embodiment, the reception SAW filter device 15a includes the first filter channel C1 spanning from the common terminal 17c to the first reception terminal 17b1 and the second filter channel C2 spanning from the common terminal 17c to the second reception terminal 17b2. Of the first and second filter channels C1 and C2, the one filter channel C2, which has poor attenuation characteristics in the transmission signal bands of the first and second reception terminals 17b1 and 17b2 when a transmission signal is inputted to the common terminal 17c, is located farther from the transmission terminal 17a than the other filter channel C1. In other words, of the first and second filter channels C1 and C2 included in the reception SAW filter device 15a, the filter channel C1, which has superior attenuation characteristics for transmission signals and is less susceptible to the influence of transmission signals inputted to the transmission SAW filter device 14a, is disposed closer to the transmission terminal 17a, whereas the filter channel C2, which has poor attenuation characteristics for transmission signals and is more susceptible to the influence of transmission signals inputted to the transmission SAW filter device 14a, is disposed farther from the transmission terminal 17a.

Generally speaking, disposing the reception SAW filter device 15a farther from, rather than closer to, the transmission terminal 17a makes it possible to prevent transmission signals inputted to the transmission terminal 17a from interfering with reception signals inputted to the reception SAW filter device 15a. Accordingly, by disposing the filter channels C1 and C2 as described above, respective degrees of negative influence in the filter channels C1 and C2, caused by the transmission signals inputted to the transmission SAW filter device 14a interfering with each other in the respective first and second filter channels C1 and C2 of the reception SAW filter device 15a, are closer to each other, which makes it possible to improve the isolation characteristics in the differential mode of the duplexer 10. Accordingly, the isolation characteristics between the transmission SAW filter device 14a and the reception SAW filter device 15a are improved without providing a shielding device such as a shield electrode or the like and increasing the size of the duplexer 10 as required in conventional devices.

Furthermore, the configuration described above makes it possible to provide the duplexer 10 with a practical configuration, in which the transmission SAW filter device 14a and the reception SAW filter device 15a are disposed on the one main surface 11a of the device substrate 11 in a well-balanced manner.

Further still, mounting the duplexer 10, which has improved isolation characteristics without an increase in size, on the module board 2 makes it possible to provide the module 1 with a practical configuration in which the size of the module has been reduced.

Furthermore, by layering the cover layer 13 on the insulating layer 12, which is disposed so as to enclose a predetermined region of the one main surface 11a of the device substrate 11 defined by the piezoelectric substrate, the duplexer 10, which includes the SAW filter devices 14a and 15b including interdigital electrodes located in a predetermined region of the device substrate 11 within a space enclosed by the insulating layer 12 between the device substrate 11 and the cover layer 13, is mounted on the mounting surface 2a of the module board 2 so that the cover layer 13 opposes the mounting surface 2a and an upper surface defined by the other main surface of the device substrate 11 is exposed from the resin layer 7.

Accordingly, by forming the duplexer 10 that includes the SAW filter devices 14a and 15b having a wafer-level chip-scale package (WL-CSP) structure in which the device substrate 11 in which the interdigital electrodes are disposed directly on the piezoelectric substrate is cut out rather than a structure in which a chip component that includes the SAW filter devices 14a and 15b is provided on a package substrate including a resin material, a ceramic material, or the like as in the past, an even lower profile and smaller size are achieved in the module 1 including the duplexer 10 mounted on the module board 2.

Note that in a state where the duplexer 10 is mounted on the mounting surface 2a of the module board 2, the resin layer 7 is preferably disposed by also filling a space between the mounting surface 2a and the cover layer 13 of the duplexer 10 with the resin. Accordingly, the resin that fills the space between the mounting surface 2a and the cover layer 13 both improve the mounting strength of the duplexer 10 and the strength of the cover layer 13 of the duplexer 10.

Although this preferred embodiment describes mounting the chip coil 3a on the mounting surface 2a of the module board in order to provide the matching circuit 3 connected to the transmission filter 14 and the reception filter 15, it should be noted that chip components such as chip resistors, chip capacitors, and the like may be mounted on the mounting surface 2a along with the chip coil 3a or instead of the chip coil 3a in accordance with the configuration of the circuitry connected to the transmission filter 14 or the reception filter 15.

Note that the present invention is not intended to be limited to the above preferred embodiments, and many variations aside from the content described above can be made without departing from the essential spirit of the present invention; furthermore, the configurations provided in the preferred embodiments may be combined in any way. For example, although the preferred embodiments include a first frequency band F1 that is set to a lower band than a second frequency band F2, the first frequency band F1 may be set to a higher band than the second frequency band F2, and the first and second frequency bands F1 and F2 may be set as appropriate in accordance with the frequency bands used in the communication performed by a communication device or the like in which the duplexer 10 is used.

Furthermore, the respective attenuation characteristics of the first and second filter channels C1 and C2 for the transmission signals in the first frequency band F1 can be derived in advance by analysis using simulations, analysis using network analyzers, or the like. Furthermore, because the respective filter channels C1 and C2 are configured so that the number of digits, the lengths, and the like of the interdigital electrodes of which those filter channels C1 and C2 are configured differently so that unbalanced reception signals are output in a balanced state through phase adjustment or the like, the attenuation characteristics in the respective filter channels C1 and C2 for the transmission signals in the first frequency band F1 can also be derived through calculations (simulations) based on the design of the respective filter channels C1 and C2.

Meanwhile, the configuration of the duplexer 10 is not limited to the WL-CSP structure, and the duplexer 10 may be formed having what is known as a CSP structure provided with a package substrate. The configuration may also be such that the duplexer 10 is mounted directly on the mounting surface 2a of the module board 2 without providing the cover layer 13.

In addition, although the preferred embodiments relate to an example of a module in which a single duplexer is mounted upon a module board, the module may be formed by mounting two or more duplexers on a module board. In this case, it is preferable to mount a switching IC on the module board and use the switching IC to select the duplexer that is to be used from among the plurality of duplexers mounted on the module board.

In addition, although the preferred embodiments include the transmission filter 14 and the reception filter 15 mounted in the same space, two spaces enclosed by the insulating layer 12 may be formed between the device substrate 11 and the cover layer 13, and the transmission filter 14 and the reception filter 15 may be disposed in those respective spaces. With such a configuration, the transmission filter 14 and the reception filter 15 are disposed so as to be structurally isolated from each other, and as a result, heat produced when power is applied to the transmission filter 14, for example, is prevented from affecting the characteristics of the reception filter 15, and isolation characteristics between the transmission filter 14 and the reception filter 15 are further improved.

Preferred embodiments of the present invention can be broadly applied in duplexers including a transmission SAW filter device and a reception SAW filter device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A duplexer comprising:
a transmission SAW filter device configured to output, to a common terminal, an unbalanced transmission signal in a first frequency band that has been inputted from an unbalanced transmission terminal;
a reception SAW filter device configured to output, in a balanced state to balanced first and second reception terminals, an unbalanced reception signal in a second frequency band inputted to the common terminal; and
a piezoelectric substrate having one main surface on which the transmission SAW filter device and the reception SAW filter device are provided; wherein
the reception SAW filter device includes:
a first filter channel spanning from the common terminal to the first balanced reception terminal; and
a second filter channel spanning from the common terminal to the second balanced reception terminal;
of the first and second filter channels, the one filter channel having lower attenuation characteristics in the unbalanced transmission signal band at the respective balanced first and second reception terminals, when the unbalanced transmission signal is inputted to the common terminal, is located farther from the unbalanced transmission terminal than the other filter channel;
the transmission SAW filter device is located in one region of the one main surface sectioned off by an imaginary line that is perpendicular or substantially perpendicular to a pair of opposing sides of the piezoelectric substrate;
the reception SAW filter device is located in another region of the one main surface sectioned off by the imaginary line;
the common terminal is disposed near or adjacent to a position where one of the pair of opposing sides intersects with the imaginary line;
the transmission terminal is disposed at the position of an end portion, of the one region, that is close to or adjacent to the other of the pair of opposing sides and far or spaced from the imaginary line;
the one filter channel is disposed on the one of the opposing sides so that the reception terminal in the one filter channel is disposed in the position of an end portion, of the other region, that is close to or adjacent to the one of the pair of opposing sides and far or spaced from the imaginary line; and
the other filter channel is disposed on the other of the opposing sides so that the reception terminal in the other filter channel is disposed in the position of an end portion, of the other region, that is close to or adjacent to the other of the pair of opposing sides and far or spaced from the imaginary line.

2. The duplexer according to claim 1, wherein the transmission SAW filter device includes interdigital electrodes and reflectors arranged in a ladder configuration.

3. The duplexer according to claim 1, wherein the transmission SAW filter device includes serial arm resonators and parallel arm resonators.

4. The duplexer according to claim 1, wherein the duplexer has one of a wafer-level chip-scale package structure and a chip scale package structure.

5. The duplexer according to claim 1, further comprising an insulating layer arranged to enclose a region on the one main surface of the piezoelectric substrate.

6. The duplexer according to claim 5, further comprising a cover layer disposed on the insulating layer, wherein a space is defined between the piezoelectric substrate and the insulating layer.

7. The duplexer according to claim 1, wherein the reception SAW filter device includes longitudinally coupled resonator filter elements connected in parallel to one another.

8. The duplexer according to claim 7, wherein the longitudinally coupled resonator filter elements include three interdigital electrodes.

9. The duplexer according to claim 7, wherein the longitudinally coupled resonator filter elements are configured so that balanced reception signals having approximately a same amplitude but with phases that are shifted from each other by approximately 180° are outputted from the balanced first and second reception terminals.

10. The duplexer according to claim 7, wherein the longitudinally coupled resonator filter elements are connected to the common terminal via a resonator.

11. The duplexer according to claim 7, wherein a first pair of the longitudinally coupled resonator filter elements are arranged in parallel or substantially in parallel to the first filter channel and a second pair of the longitudinally coupled resonator filter elements are arranged in parallel or substantially in parallel to the second filter channel.

12. A module comprising:
the duplexer according to claim 1; and
a module board on which the duplexer is mounted.

13. A mobile communication terminal device comprising the module according to claim 12.

14. The mobile communication terminal device according to claim 13, wherein the mobile communication terminal device is a cellular phone.

15. The module according to claim 12, wherein the module is a high-frequency antenna switching module.

16. The module according to claim 12, wherein the module board is a ceramic multilayer board including a plurality of dielectric layers.

17. The module according to claim 16, further comprising via conductors in the multilayer board.

18. The module according to claim 12, further comprising a matching circuit including a chip coil provided on a mounting surface of the module board.

19. The module according to claim 12, further comprising a resin layer arranged to cover the duplexer on the module board.

* * * * *